United States Patent
Pellerano et al.

(10) Patent No.: US 7,856,212 B2
(45) Date of Patent: Dec. 21, 2010

(54) MILLIMETER-WAVE PHASE-LOCKED LOOP WITH INJECTION-LOCKED FREQUENCY DIVIDER USING QUARTER-WAVELENGTH TRANSMISSION LINE AND METHOD OF CALIBRATION

(75) Inventors: Stefano Pellerano, Beaverton, OR (US); Rajarshi Mukhopadhyay, Richardson, TX (US); Georgios Palaskas, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 689 days.

(21) Appl. No.: 11/835,330

(22) Filed: Aug. 7, 2007

(65) Prior Publication Data

US 2009/0042528 A1    Feb. 12, 2009

(51) Int. Cl.
*H04B 1/40* (2006.01)
*H04K 3/00* (2006.01)

(52) U.S. Cl. .................. 455/76; 455/180.3; 455/260; 327/147; 375/376

(58) Field of Classification Search .................. 455/76, 455/180.3, 260; 327/147; 331/44; 375/376
See application file for complete search history.

(56) References Cited

U.S. PATENT DOCUMENTS

| | | | |
|---|---|---|---|
| 7,250,815 B2 | 7/2007 | Taylor et al. | |
| 7,333,423 B2 | 2/2008 | Palaskas et al. | |
| 7,362,246 B2 | 4/2008 | Park et al. | |
| 2006/0198476 A1 | 9/2006 | Palaskas et al. | |
| 2007/0001717 A1* | 1/2007 | Matsumoto et al. | 327/112 |
| 2007/0002722 A1 | 1/2007 | Palaskas et al. | |
| 2007/0028208 A1 | 2/2007 | Maki | |
| 2007/0041470 A1 | 2/2007 | Palaskas et al. | |
| 2007/0114335 A1 | 5/2007 | Odanaka | |
| 2007/0230615 A1 | 10/2007 | Taylor et al. | |
| 2007/0279225 A1 | 12/2007 | Pellerano et al. | |
| 2008/0070512 A1 | 3/2008 | Palaskas et al. | |

OTHER PUBLICATIONS

Rategh et al, A CMOS Frequency Synthesizer with an Injection-Locked Frequency Divider for a 5-GHz Wireless LAN receiver, May 2000, IEEE Journal on Solid-State Circuits, vol. 35, pp. 780-787.*

Bonfanti, A. , et al., "A 15-GHz broad-band 2 frequency divider in 0.13 m CMOS for quadrature generation", *In IEEE Microwave and Wireless Components Letters, vol. 15*, (Nov. 2005), 724-726.

Floyd, et al., "A Silicon 60GHz receiver and transmitter chipset for broadband communications", *IEEE Intl. Solid-State Circuits Conf.*, (Feb. 2006), 184-185.

Razavi, B. , "CMOS transceivers for the 60-GHz band", *IEEE Radio Freq. Int. Circuits Symp.*, (Jun. 2006).

* cited by examiner

*Primary Examiner*—Lee Nguyen
(74) *Attorney, Agent, or Firm*—Schwegman, Lundberg & Woessner, P.A.; Gregory J. Gorrie (57) ABSTRACT

Embodiments of a millimeter-wave phase-locked loop with an injection-locked frequency divider (ILFD) are generally described herein. Other embodiments may be described and claimed. In some embodiments, the ILFD uses a quarter-wavelength transmission line. A method of calibrating an ILFD is also provided to allow the ILFD to operate at or near the center of its locking range for each of a plurality of VCO oscillating frequency bands.

16 Claims, 4 Drawing Sheets

MILLIMETER-WAVE PLL

FIG. 1
MILLIMETER-WAVE PLL

MILLIMETER-WAVE PHASE-LOCKED LOOP WITH INJECTION-LOCKED FREQUENCY DIVIDER USING QUARTER-WAVELENGTH TRANSMISSION LINE AND METHOD OF CALIBRATION

TECHNICAL FIELD

Some embodiments pertain to millimeter-wave communications. Some embodiments pertain to millimeter-wave phase-locked loops (PLLs). Some embodiments pertain to injection-locked frequency dividers (ILFDs).

BACKGROUND

Millimeter-wave frequencies may be used to provide higher data rate communications for wireless networks, backhaul operations, and home entertainment applications, among others. PLLs that are utilized by receivers and transmitters operating at millimeter-wave frequencies are more difficult to design and implement because of the higher frequencies that need to be divided down to lower frequencies for phase comparison with a reference source. Some PLLs use ILFDs to initially divide down a high-frequency output of a voltage-controlled oscillator (VCO). One issue with conventional ILFDs is that the limited locking range makes them difficult to implement within millimeter-wave PLLs. Another issue with conventional ILFDs is that their power consumption makes them less desirable for use in mobile communication devices. ILFD locking range can be extended to some extent at the expense of higher power consumption.

Thus, there are general needs for millimeter-wave PLLs suitable for use in millimeter-wave communication devices. There are also general needs for ILFDs with a broader locking range. There are also general needs for ILFDs with lower power consumption suitable for use mobile communication devices.

DETAILED DESCRIPTION

The following description and the drawings sufficiently illustrate specific embodiments of the invention to enable those skilled in the art to practice them. Other embodiments may incorporate structural, logical, electrical, process, and other changes. Examples merely typify possible variations. Individual components and functions are optional unless explicitly required, and the sequence of operations may vary. Portions and features of some embodiments may be included in, or substituted for, those of other embodiments. Embodiments of the invention set forth in the claims encompass all available equivalents of those claims. Embodiments of the invention may be referred to herein, individually or collectively, by the term "invention" merely for convenience and without intending to limit the scope of this application to any single invention or inventive concept if more than one is in fact disclosed.

Figure 1:
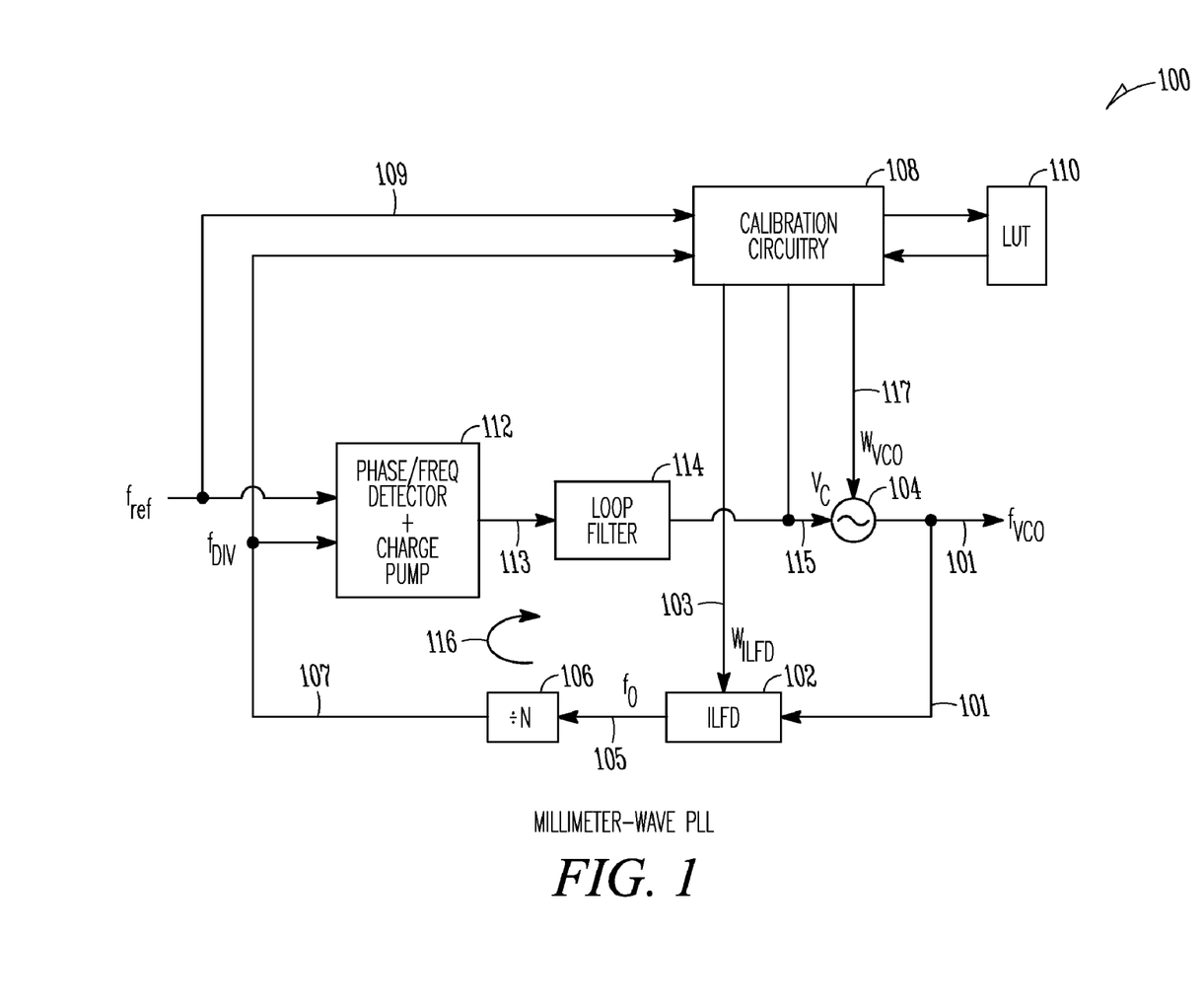
FIG. 1 is a block diagram of a millimeter-wave phase-locked loop (PLL) in accordance with some embodiments of the present invention.

FIG. 1 is a block diagram of a millimeter-wave PLL in accordance with some embodiments of the present invention. Millimeter-wave PLL 100 includes injection-locked frequency divider (ILFD) 102 to generate divided output frequency 105 from injected millimeter-wave frequency 101. Millimeter-wave PLL 100 also includes calibration circuitry 108 to determine values for ILFD control signal ($W_{ILFD}$) 103 to be applied to ILFD 102 for a selected VCO oscillating frequency band. The values determined for control signal 103 allow ILFD 102 to operate at or near a center of its locking range. Millimeter-wave PLL 100 also includes VCO 104 to generate injected millimeter-wave frequency 101 (i.e., $f_{VCO}$) as the output signal of PLL 100 and the injected signal to the ILFD 102. Millimeter-wave PLL 100 also includes other circuitry discussed in more detail below.

When locked, ILFD 102 divides the frequency of the signal injected by the VCO 104 and generates divided output frequency 105 as its output. VCO 104 generates injected millimeter-wave frequency 101 as the output frequency of PLL 100 based on VCO control voltage ($V_c$) 115 and the selected frequency band ($W_{vco}$) 117. When ILFD 102 is not locked, its output frequency may have no particular relationship with injected millimeter-wave frequency 101. The locking range of ILFD 102 is discussed in more detail below.

ILFD 102 may be viewed as a first divider stage (e.g., a prescaler) and millimeter-wave PLL 100 may include a second divider stage 106 to further divide the divided output frequency 105 by an integer value (N) to provide a divided down frequency 107 ($f_{DIV}$) for comparison with reference frequency 109 as part of feedback loop 116. Feedback loop 116 may include VCO 104, ILFD 102, and second divider stage 106. Feedback loop 116 may also include phase/frequency detector and charge pump circuitry 112 and loop filter 114. Phase/frequency detector and charge pump circuitry 112 may compare the divided down frequency 107 with reference frequency 109 to generate output 113. Output 113 is then filtered by the loop filter 114 to generate VCO control voltage 115 that controls VCO 104.

In some embodiments, millimeter-wave PLL 100 may also include a look-up table (LUT) 110 to store the values for ILFD control signal ($W_{ILFD}$) 103 for each of a plurality of selectable VCO oscillating frequency bands ($W_{vco}$). Each value of ILFD control signal 103 when applied to ILFD 102 may cause ILFD 102 to operate at or near the center of the locking range for an associated selectable VCO oscillating frequency band. In some embodiments, ILFD control signal 103 may comprise a control voltage (VR) or a tuning voltage. The oscillating frequency band of VCO 104 may be selected based on band-selection signal ($W_{VCO}$) 117 applied to VCO 104. In some embodiments, band-selection signal 117 may be a band-selection digital word, although the scope of the invention is not limited in this respect.

In some embodiments, the control voltage may be a divider control voltage used to tune and change the center of the locking range of ILFD 102. In a practical implementation, a digital-to-analog converter (DAC) may be used to generate a finite set of divider control voltages, which may range from 0 to 1 volts, although the scope of the invention is not limited in this respect. The DAC may have a digital word as its input (e.g., $W_{ILFD}$) and may generate a corresponding output voltage (i.e., the divider control voltage) to tune ILFD 102.

In some embodiments, the output frequency of PLL 100 (i.e., injected millimeter-wave frequency 101) may be determined based on a channel that will be used for either transmission or reception. In these embodiments, the correct VCO band may be selected so that the VCO output frequency will be near that channel frequency. PLL 100 may then control VCO control voltage 115 and lock the VCO to the channel frequency. Since ILFD 102 needs to be locked, after the right VCO band has been selected, the right $W_{ILFD}$ control signal may also be selected from LUT 110. As discussed in more detail below, correspondence between VCO band-selection signals ($W_{VCO}$) 117 and ILFD controls (i.e., $W_{ILFD}$) may be determined during the calibration.

In some embodiments, calibration circuitry 108 may be configured to perform a calibration procedure for PLL 100. As part of the calibration procedure, calibration circuitry 108 may be configured to measure the divided down output frequency 107 for different settings of ILFD control signal 103 when applied to ILFD 102 for a selected VCO oscillating frequency band to identify the locking range for ILFD 102. Calibration circuitry 108 may also be configured to select a value for ILFD control signal 103 for the selected VCO oscillating frequency band that causes ILFD 102 to operate at or near the center of the locking range. Divided down output frequency 107 may be generated by second divider stage 106 that divides the ILFD output frequency 105 by an integer value.

In some embodiments, during the calibration procedure, the calibration circuitry 108 may also repeat measuring divided down output frequency 107 for the different settings of ILFD control signal 103 to identify a locking range for ILFD 102 for each of a plurality of VCO oscillating frequency bands. Calibration circuitry 108 may also store the selected value for the ILFD control signal in LUT 110 for each of the VCO oscillating frequency bands of VCO 104. The selected values for ILFD control signal 103 allows ILFD 102 to operate at or near a center of the locking range for various VCO oscillating frequencies. During the calibration procedure, the calibration circuitry sets VCO control voltage 115 to a predetermined value (e.g., $V_{DD}/2$) and disables phase/frequency detector and charge pump 112.

In some embodiments, the calibration procedure may be performed each time PLL 100 is powered up, although the scope of the invention is not limited in this respect. When performed at power-up, the calibration procedure may, in addition to broadening the range of the PLL and reducing noise (by operating near center frequency of the ILFD), compensate for component variations over time as well as for variations in temperature. In other embodiments, the calibration procedure may be performed after fabrication of PLL 100 and it may at least compensate for process variations of the components.

In some embodiments, second divider stage 106 may comprise programmable digital circuitry (e.g., divide by N circuitry) that divides ILFD output frequency 105 by an integer value (e.g., N). In some embodiments, the integer value may be selected during operation to set the PLL output frequency.

In some embodiments, reference frequency 109 and the divided down output frequency 107 may be around 40 MHz. In these embodiments, when PLL output frequency ($f_{vco}$) is in the 60 GHz range and ILFD divided output frequency 105 is one-forth of the injected millimeter-wave frequency 101, N may have a value on the order of 350-400, although the scope of the invention is not limited in this respect, as PLL 100 may operate at other millimeter-wave frequencies (e.g., output frequency ($f_{vco}$) may be 50 GHz or 76 GHz) or may use a crystal at a different frequency (i.e., reference frequency 109 may be a frequency other than 40 MHz) or may use an ILFD divider with a divider ratio different from 4. Although the calibration procedure is discussed with respect to a divide-by-four ILFD, it is equally applicable to ILFDs with other division ratios, such as a divide-by-two ratio.

Although PLL 100 is illustrated as having several separate functional elements, one or more of the functional elements may be combined and may be implemented by combinations of software-configured elements, such as processing elements including digital signal processors (DSPs), and/or other hardware elements. For example, some elements may comprise one or more microprocessors, DSPs, application specific integrated circuits (ASICs), radio-frequency integrated circuits (RFICs) and combinations of various hardware and logic circuitry for performing at least the functions described herein. In some embodiments, the functional elements of PLL 100 may refer to one or more processes operating on one or more processing elements.

Figure 2A:
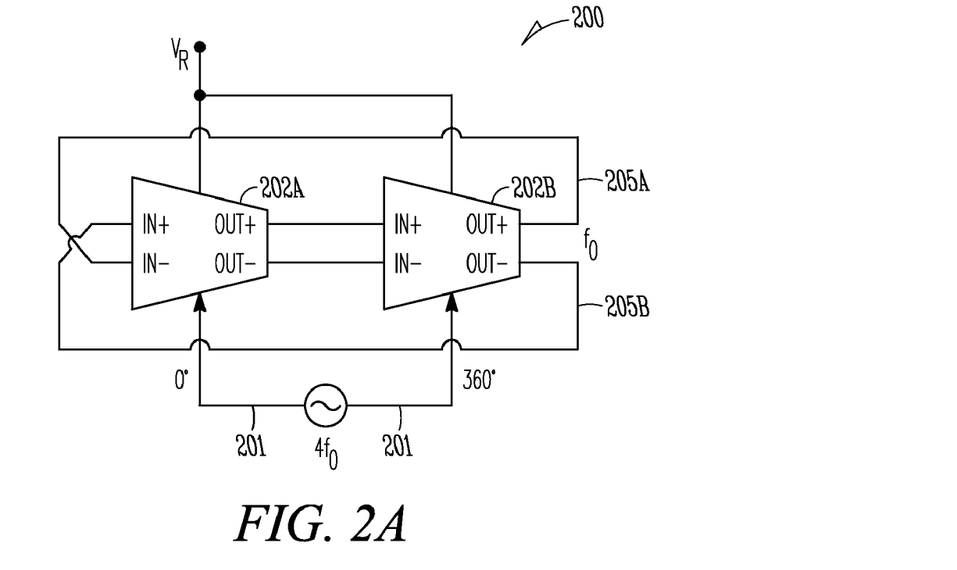
FIG. 2A is a block diagram of an injection-locked frequency divider (ILFD) in accordance with some embodiments of the present invention.

FIG. 2A is a block diagram of an ILFD in accordance with some embodiments of the present invention. ILFD 200 may be suitable for use as ILFD 102 (FIG. 1), although the scope of the invention is not limited in this respect. ILFD 200 comprises first stage 202A and second stage 202B arranged in a ring-oscillator configuration (e.g., configured as a ring oscillator). Each stage may receive in-phase versions of injected signal at millimeter-wave frequency 201 (e.g., $4f_0$). Injected millimeter-wave frequency 201 may correspond to injected millimeter-wave frequency 101 (FIG. 1). Each stage 202 may be responsive to the ILFD control signal 103 (FIG. 1) to cause ILFD 200 to operate at or near the center of its locking range. Divided frequency output, illustrated as either out+ 205A or out− 205B, generated by second stage 202B, may correspond to the divided frequency output 105 (FIG. 1).

Figure 2B:
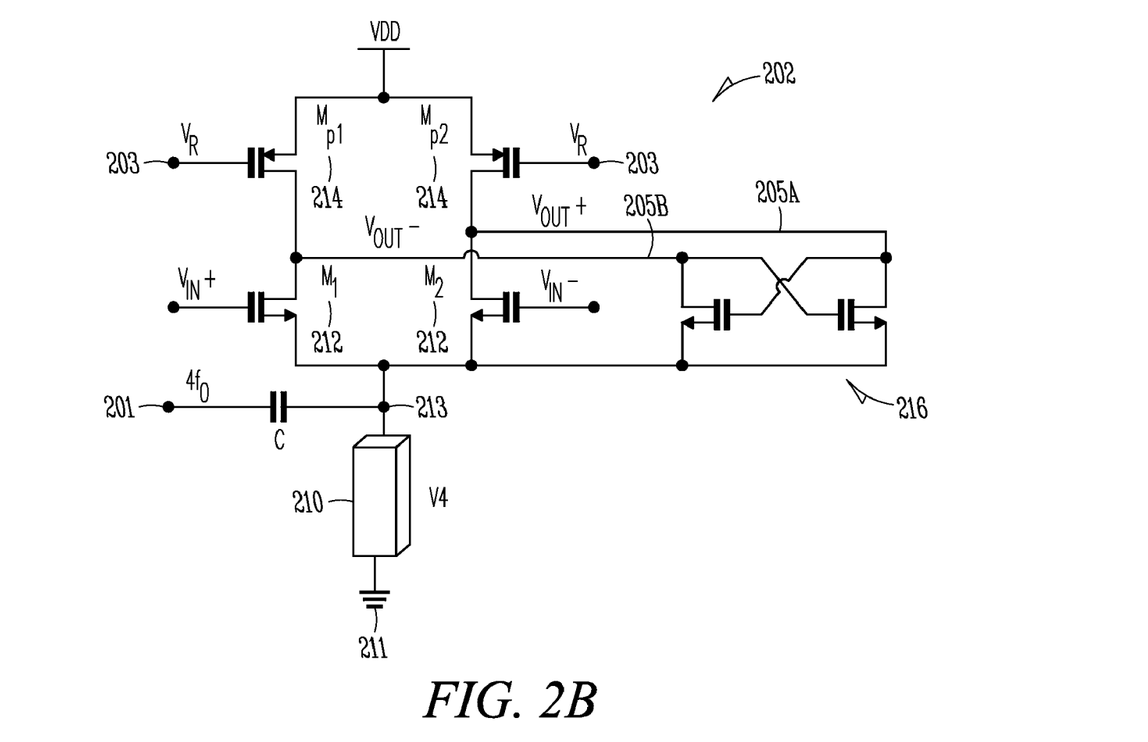
FIG. 2B is a simplified circuit diagram of one stage of the injection-locked frequency divider of FIG. 2A in accordance with some embodiments of the present invention.

FIG. 2B is a simplified circuit diagram of one stage of the ILFD of FIG. 2A in accordance with some embodiments of the present invention. Stage 202 may be suitable for use as first stage 202A and/or second stage 202B (FIG. 2A), although the scope of the invention is not limited in this respect.

Stage 202 includes pseudo-differential pair 212 of transistors (illustrated as $M_1$ and $M_2$) and quarter-wavelength transmission line 210 coupled between sources 213 of pseudo-differential pair 212 and ground 211 to receive injected millimeter-wave frequency ($4f_0$) 201 at sources 213. Stage 202 also includes a pair of transistors 214 (illustrated as $M_{p1}$ & $M_{p2}$) operating as voltage controlled resistors responsive to control voltage ($V_R$) 203 generated from ILFD control signal 103 (FIG. 1). In some embodiments, transistors 214 may be configured to operate as voltage-controlled resistors (MOS devices in their ohmic region). Stage 202 may also include a cross-coupled pair of transistors 216 to latch outputs 205A and 205B.

Quarter-wavelength transmission line 210 may provide high impedance at millimeter-wave frequencies and may further provide a short-to-ground at DC for pseudo-differential pair 212. Because quarter-wavelength transmission line 210 provides a short-to-ground at DC, current through pseudo-differential pair 212 may be maximized and a full voltage swing from ground to $V_{DD}$ may be provided at the output of the divider. Quarter-wavelength transmission line 210 may provide a high impedance at a millimeter-wave frequency that may be at or near to the output frequency of VCO 104. This may help maximize the amount of signal current at the VCO output frequency (i.e., injected millimeter-wave frequency 101) that gets injected into ILFD 102, thus helping to maximize the ILFD locking rage for a given control signal 103. This is unlike some conventional ILFDs that inject an input signal onto a gate of a current bias transistor.

In some example embodiments, quarter-wavelength transmission line 210 may provide a high impedance at a millimeter-wave frequency of approximately 60 GHz, when the output frequency (e.g., $f_{VCO}$) ranges between approximately 55 and 65 GHz, while in other example embodiments, quarter-wavelength transmission line 210 may provide a high impedance at a millimeter-wave frequency of approximately 76 GHz, when the output frequency ranges between approximately 74 and 77 GHz, although the scope of the invention is not limited in this respect.

Figure 3A:
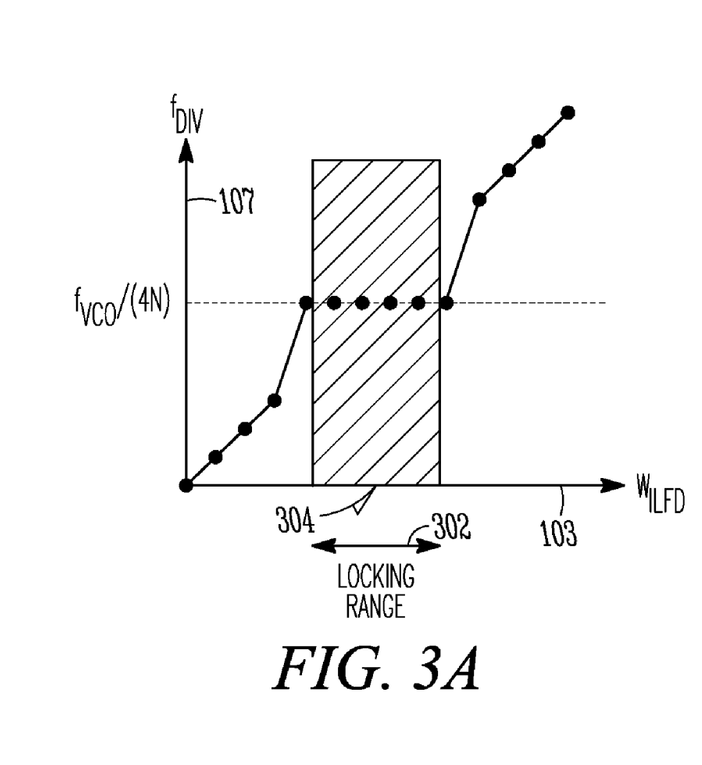
FIGS. 3A and 3B illustrate determination of the locking range of an injection-locked frequency divider in accordance with some embodiments of the present invention.
Figure 3B:
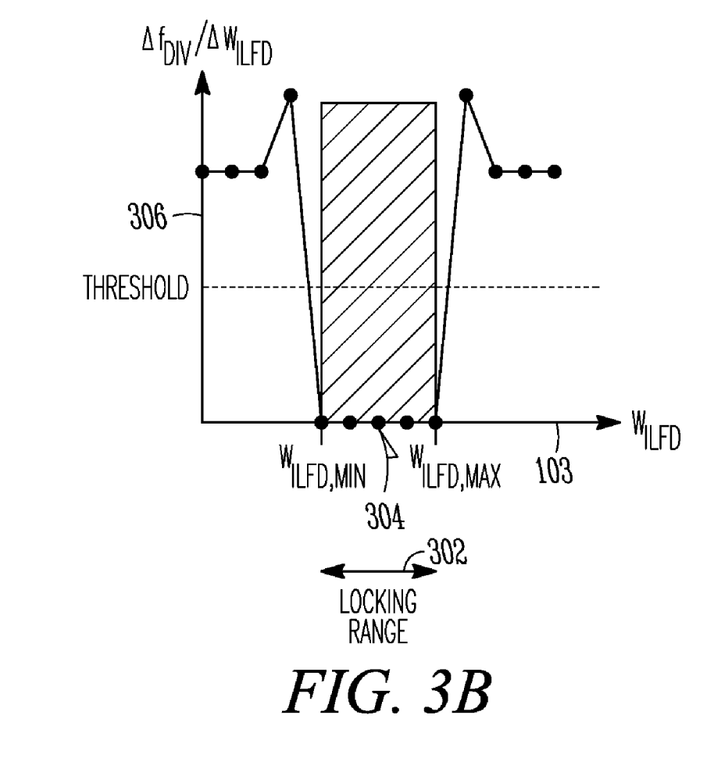

FIGS. 3A and 3B illustrate determination of the locking range of an ILFD in accordance with some embodiments of the present invention. FIG. 3A shows what a measurement of the divided down frequency $f_{DIV}$ (y axis) would look like for various values of ILFD control signal ($W_{ILFD}$) 103 (x axis). When the ILFD is not locked, its output frequency is not related to the VCO injected frequency, but depends on the control signal $W_{ILFD}$. As the control $W_{ILFD}$ is increased, the output frequency of the ILFD and thus the divided down frequency $f_{DIV}$ also increases. However, for a particular range of control signal $W_{ILFD}$, the ILFD is locked, and it correctly performs the division operation on the injected frequency. Its output frequency remains equal to the divided injected frequency even if the control signal is changed. In this example, when ILFD 102 (FIG. 1) is a divide-by-four ILFD, the divided down output frequency 107 is equal $f_{VCO}/4N$ when the ILFD is locked. If the control signal is further increased, the ILFD exits its locking condition, and again $f_{DIV}$ becomes dependent on $W_{ILFD}$. The set of $W_{ILFD}$ values for which $f_{DIV}$ remains constant represents locking range 302 of the ILFD. Values for ILFD control signal ($W_{ILFD}$) 103 may be applied to ILFD 102 for a selected oscillating frequency band to cause ILFD 102 to operate at or near center 304 of locking range 302.

FIG. 3B illustrates the determination of values for ILFD control signal ($W_{ILFD}$) 103 to be applied to ILFD 102 for a selected oscillating frequency band that cause ILFD 102 to operate at or near center 304 of locking range 302. Locking range 302 may be identified by differentiating the frequency plot of FIG. 3A. Accordingly, the y-axis of FIG. 3B shows the change in the divided down output frequency ($f_{DIV}$) 107 over the change in $W_{ILFD}$ (i.e., $\Delta f_{DIV}/\Delta W_{ILFD}$ 306). In this way, calibration circuitry 108 may easily identify locking range 302 as the set of values for which the $\Delta f_{DIV}/\Delta W_{ILFD}$ is below a given threshold and locate the center of the locking range 304.

Figure 4:
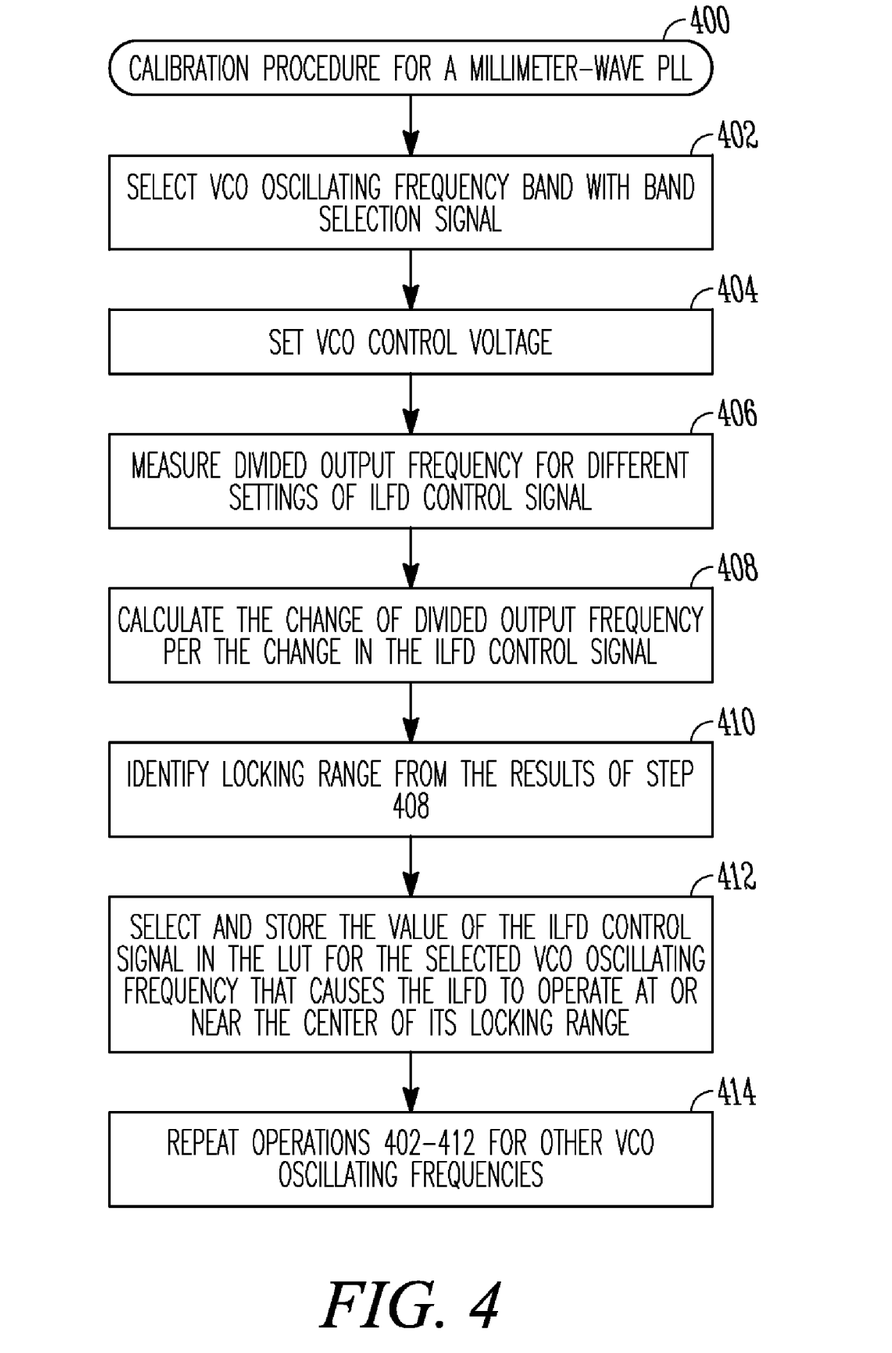
FIG. 4 is a flow chart of a calibration procedure for a millimeter-wave phase-locked loop (PLL) in accordance with some embodiments of the present invention.

FIG. 4 is a flow chart of a calibration procedure for a millimeter-wave PLL in accordance with some embodiments of the present invention. Calibration procedure 400 may be performed by calibration circuitry 108 (FIG. 1) to determine and store values for ILFD control signal 103 (FIG. 1) that allows ILFD 102 to operate at or near a center of the locking range for a plurality of VCO oscillating frequency bands.

In operation 402, a VCO oscillating frequency band is selected using band selection signal 117 (FIG. 1). Band selection signal 117 (FIG. 1) may be generated by calibration circuitry 108 (FIG. 1).

In operation 404, VCO control voltage 115 (FIG. 1) may be set. In some embodiments, during operation 404, calibration circuitry 108 (FIG. 1) may set a VCO control voltage 115 (FIG. 1) to a predetermined value (e.g., $V_{DD}/2$) and may disable phase/frequency detector and charge pump 112 (FIG. 1).

In operation 406, the divided down output frequency 107 (FIG. 1) may be measured for different settings of ILFD control signal 103 (FIG. 1) when applied to ILFD 102 (FIG. 1) for a selected VCO oscillating frequency band.

Operation 408 includes calculating the change of divided output frequency 107 (FIG. 1) per the change in the ILFD control signal 103 (FIG. 1) as illustrated in FIG. 3B.

Operation 410 includes identifying the locking range for ILFD 102 (FIG. 1) for the selected VCO oscillating frequency based on operation 408.

In operation 412, a value for the ILFD control signal 103 (FIG. 1) for the selected VCO oscillating frequency band is selected that causes ILFD 102 (FIG. 1) to operate at or near a center 304 (FIG. 3B) of the locking range 302 (FIG. 3B). In operation 412, the selected value for the ILFD control signal may be stored in LUT 110 (FIG. 1) for each of the oscillating frequency bands of VCO 104 (FIG. 1). The selected values for the ILFD control signal allows ILFD 102 (FIG. 1) to operate at or near the center of the locking range for each VCO oscillating frequency band.

Operation 414 includes repeating operations 402 through 412 for other VCO frequency bands. The divided down output frequency 107 (FIG. 1) may be measured for the different settings of ILFD control signal 103 (FIG. 1) to identify in operation 410 a locking range for ILFD 102 (FIG. 1) for each of the VCO oscillating frequency bands.

Although the individual operations of procedure 400 are illustrated and described as separate operations, one or more of the individual operations may be performed concurrently, and nothing requires that the operations be performed in the order illustrated.

In some embodiments, a wireless communication device comprises front-end circuitry for communicating millimeter-wave signals with one or more antennas. The front circuitry may comprise a millimeter-wave PLL, such as PLL 100 (FIG. 1) for use in generating the millimeter-wave signals for transmission and/or reception.

In some embodiments, PLL 100 (FIG. 1) may be part of a wireless communication device may communicate multicarrier signals, such as OFDM communication signals, over a multicarrier communication channel. The multicarrier communication channel may be within a predetermined frequency spectrum and may comprise a plurality of orthogonal subcarriers. In some embodiments, the wireless communication device may communicate in accordance with a multiple access technique, such as orthogonal frequency division multiple access (OFDMA), although the scope of the invention is not limited in this respect. In some embodiments, the wireless communication device may communicate using spread-spectrum signals, although the scope of the invention is not limited in this respect.

In some embodiments, PLL 100 (FIG. 1) may be part of a portable wireless device, such as a personal digital assistant (PDA), a laptop or a portable computer with wireless communication capability, a web tablet, a wireless telephone, a wireless headset, a pager, an instant messaging device, a digital camera, an access point, a television, a medical device (e.g., a heart rate monitor, a blood pressure monitor, etc.), or another device that may receive and/or transmit information wirelessly.

In some embodiments, PLL 100 (FIG. 1) may be part of a wireless device that may communicate using the millimeter-wave signals comprising millimeter-wave frequencies between approximately 57 and 90 gigahertz (GHz). In some embodiments, the millimeter-wave signals may be multicarrier signals. Although many embodiments of the present invention are directed to using millimeter-wave signals, the scope of the invention is not limited in this respect as other frequencies may also be suitable.

In some embodiments, PLL 100 (FIG. 1) may be part of a wireless device that may communicate millimeter-wave signals in accordance with specific communication standards or proposed specifications, such as the Institute of Electrical and Electronics Engineers (IEEE) standards including the IEEE 802.15 standards and proposed specifications for millimeter-wave communications (e.g., the IEEE 802.15 task group 3c 'Call For Intent' (CFI) dated December 2005), although the scope of the invention is not limited in this respect as they may also be suitable to transmit and/or receive communications in accordance with other techniques and standards. For more information with respect to the IEEE 802.15 standards, please refer to "IEEE Standards for Information Technology—Telecommunications and Information Exchange between Systems"—Part 15.

Unless specifically stated otherwise, terms such as processing, computing, calculating, determining, displaying, or the like, may refer to an action and/or process of one or more processing or computing systems or similar devices that may manipulate and transform data represented as physical (e.g., electronic) quantities within a processing system's registers and memory into other data similarly represented as physical quantities within the processing system's registers or memories, or other such information storage, transmission or display devices. Furthermore, as used herein, a computing device includes one or more processing elements coupled with computer-readable memory that may be volatile or non-volatile memory or a combination thereof.

Embodiments of the invention may be implemented in one or a combination of hardware, firmware, and software. Embodiments of the invention may also be implemented as instructions stored on a computer-readable medium, which may be read and executed by at least one processor to perform the operations described herein. A machine-readable medium may include any mechanism for storing or transmitting information in a form readable by a machine (e.g., a computer). For example, a machine-readable medium may include read-only memory (ROM), random-access memory (RAM), magnetic disk storage media, optical storage media, flash-memory devices, and others.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. A millimeter-wave phase-locked loop (PLL) comprising:
    an injection-locked frequency divider (ILFD) to generate a divided output frequency from an injected millimeter-wave frequency;
    calibration circuitry to determine values for an ILFD control signal to be applied to the ILFD for a selected oscillating frequency band to cause the ILFD to operate at or near a center of a locking range of the ILFD; and
    a voltage controlled oscillator (VCO) to generate the injected millimeter-wave frequency as an output frequency of the PLL based at least in part on the divided output frequency generated by the ILFD,
    wherein the ILFD comprises:
    a pseudo-differential pair of transistors;
    a quarter-wavelength transmission line coupled between the pseudo-differential pair and ground to receive the injected millimeter-wave frequency; and
    a pair of transistors operating as voltage controlled resistors responsive to the ILFD control signal.

2. The millimeter-wave PLL of claim 1 wherein the quarter-wavelength transmission line provides a high impedance at a millimeter-wave frequency and a short-to-ground at DC for the pseudo-differential pair.

3. The millimeter-wave PLL of claim 1 further comprising a look-up table (LUT) to store the values for the ILFD control signal for each of a plurality of selectable VCO oscillating frequency bands,
    wherein each value of the ILFD control signal when applied to the ILFD causes the ILFD to operate at or near the center of the locking range for an associated one of the selectable VCO oscillating frequency bands.

4. The millimeter-wave PLL of claim 3 wherein the calibration circuitry is configured to perform a calibration procedure for the PLL,
    wherein as part of the calibration procedure, the calibration circuitry is configured to:
    measure a further divided down output frequency for different settings of the ILFD control signal when applied to the ILFD for a selected VCO oscillating frequency band to identify the locking range for the ILFD; and
    select a value for the ILFD control signal for the selected VCO oscillating frequency band that causes the ILFD to operate at or near the center of the locking range,
    wherein the further divided down output frequency is generated by a second divider stage that divides the divided output frequency provided by the ILFD by an integer value.

5. The millimeter-wave PLL of claim 4 wherein during the calibration procedure, the calibration circuitry further:
    repeats the measuring of the further divided down output frequency for the different settings of the ILFD control signal to identify the locking range for the ILFD for each of a plurality of VCO oscillating frequency bands; and
    stores the selected value for the ILFD control signal in the LUT for each of the plurality of VCO oscillating frequency bands, wherein the selected values for the ILFD control signal allows the ILFD to operate at or near the center of the locking range for the plurality of VCO oscillating frequencies, and
    wherein during the calibration procedure, the calibration circuitry sets a VCO control voltage to a predetermined value to disable a phase/frequency detector and charge pump of the PLL.

6. The millimeter-wave PLL of claim 4 wherein the calibration procedure is performed each time the PLL is powered up.

7. The millimeter-wave PLL of claim 1 wherein the ILFD is a first divider stage of the PLL, and
    wherein the millimeter-wave PLL further comprises a second divider stage to divide the divided output frequency of the ILFD by an integer value to provide a further divided down output frequency for comparison with a reference frequency for use in generating a VCO control voltage for controlling the VCO.

8. The millimeter-wave PLL of claim 1 wherein the ILFD comprises first and second stages in a ring-oscillator configuration, each stage to receive in-phase versions of the injected millimeter-wave frequency,
    wherein each stage comprises a pseudo-differential pair of transistors, a quarter-wavelength transmission line coupled between the pseudo-differential pair and ground to receive the injected millimeter-wave frequency, and a pair of transistors operating as voltage controlled resistors responsive to the ILFD control signal, and wherein each stage is responsive to the ILFD control signal to cause the ILFD to operate at or near the center of the locking range.

9. An injection-locked frequency divider (ILFD) to generate a divided output frequency from an injected millimeter-wave frequency comprising:

a pseudo-differential pair of transistors;

a quarter-wavelength transmission line coupled between the pseudo-differential pair and ground to receive the injected millimeter-wave frequency; and a pair of transistors operating as voltage-controlled resistors responsive to an ILFD control signal selected to cause the ILFD to operate at or near a center of a locking range of the ILFD.

10. The ILFD of claim 9 wherein the quarter-wavelength transmission line provides a high impedance at a millimeter-wave frequency and a short-to-ground at DC for the pseudo-differential pair of transistors to help maximize current through the pseudo-differential pair providing for a wider output signal swing.

11. The ILFD of claim 10 wherein the ILFD comprises first and second stages in a ring-oscillator configuration, each stage to receive in-phase versions of the injected millimeter-wave frequency, wherein each stage comprises a pseudo-differential pair of transistors, a quarter-wavelength transmission line coupled between the pseudo-differential pair and ground to receive the injected millimeter-wave frequency, and a pair of transistors operating as voltage controlled resistors responsive to an ILFD control signal selected to cause the ILFD to operate at or near a center of the locking range, and wherein each stage is responsive to the ILFD control signal to cause the ILFD to operate at or near the center of the locking range.

12. The ILFD of claim 9 further comprising a cross-coupled pair of transistors to latch an output of the ILFD.

13. A method of calibrating an injection-locked frequency divider (ILFD) comprising:

measuring a further divided down output frequency for different settings of an ILFD control signal when applied to the ILFD for a selected VCO oscillating frequency band to identify a locking range for the ILFD; and selecting a value for the ILFD control signal for the selected VCO oscillating frequency band that causes the ILFD to operate at or near a center of the locking range, wherein for each of a plurality of selected VCO oscillating frequency bands, the method includes providing a value for the ILFD control signal to be applied to the ILFD to cause the ILFD to operate at or near the center of the locking range for the selected oscillating frequency band, wherein the method further comprises:

repeating the measuring of the further divided down output frequency for the different settings of the ILFD control signal to identify a locking range for each of the selected VCO oscillating frequency bands; and storing the selected value for the ILFD control signal in the LUT for each of the VCO oscillating frequency bands, wherein the selected values for the ILFD control signal allows the ILFD to operate at or near the center of the locking range for the VCO oscillating frequency bands, and wherein during the measuring, a VCO control voltage is set to a predetermined value to disable a phase/frequency detector and charge pump.

14. A wireless communication device comprising front-end circuitry for communicating millimeter-wave signals, wherein the front-end circuitry comprises a millimeter-wave phase-locked loop (PLL) for use in generating the millimeter-wave signals, and wherein the millimeter-wave PLL comprises:

an injection-locked frequency divider (ILFD) to generate a divided output frequency from an injected millimeter-wave frequency;

calibration circuitry to determine values for an ILFD control signal to be applied to the ILFD for a selected VCO oscillating frequency band to cause the ILFD to operate at or near a center of a locking range of the ILFD; and a voltage controlled oscillator (VCO) to generate the injected millimeter-wave frequency as an output frequency of the PLL based at least in part on the divided output frequency generated by the ILFD, wherein the ILFD comprises:

a pseudo-differential pair of transistors;

a quarter-wavelength transmission line coupled between the pseudo-differential pair and ground to receive the injected millimeter-wave frequency; and a pair of transistors operating as voltage controlled resistors responsive to the ILFD control signal.

15. The wireless communication device of claim 14 wherein the quarter-wavelength transmission line provides a high impedance at a millimeter-wave frequency and a short-to-ground at DC for the pseudo-differential pair.

16. A wireless communication device comprising front-end circuitry for communicating millimeter-wave signals, wherein the front-end circuitry comprises a millimeter-wave phase-locked loop (PLL) for use in generating the millimeter-wave signals, and wherein the millimeter-wave PLL comprises:

an injection-locked frequency divider (ILFD) to generate a divided output frequency from an injected millimeter-wave frequency;

calibration circuitry to determine values for an ILFD control signal to be applied to the ILFD for a selected VCO oscillating frequency band to cause the ILFD to operate at or near a center of a locking range of the ILFD; and a voltage controlled oscillator (VCO) to generate the injected millimeter-wave frequency as an output frequency of the PLL based at least in part on the divided output frequency generated by the ILFD, wherein for each of a plurality of selectable VCO oscillating frequency bands, the calibration circuitry is to provide a value for the ILFD control signal to be applied to the ILFD to cause the ILFD to operate at or near the center of the locking range for the selected oscillating frequency band, wherein the PLL further comprises a look-up table (LUT) to store the values for the ILFD control signal for each of a plurality of selectable VCO oscillating frequency bands, wherein each value of the ILFD control signal when applied to the ILFD causes the ILFD to operate at or near the center of the locking range for an associated one of the selectable VCO oscillating frequency bands, wherein the calibration circuitry is configured to perform a calibration procedure for the PLL, wherein as part of the calibration procedure, the calibration circuitry is configured to:

measure a further divided down output frequency for different settings of the ILFD control signal when applied to the ILFD for the selected VCO oscillating frequency band to identify the locking range for the ILFD; and select a value for the ILFD control signal for the selected VCO oscillating frequency band that causes the ILFD to operate at or near the center of the locking range, wherein the further divided down output frequency is generated by a second divider stage that divides the ILFD output frequency by an integer value, wherein during the calibration procedure, the calibration circuitry further:

repeats the measuring of the further divided down output frequency for the different settings of the ILFD control signal to identify the locking range for the ILFD for each of a plurality of VCO oscillating frequency bands; and stores the selected value for the ILFD control signal in the LUT for each of the plurality of VCO oscillating frequency bands, wherein the selected values for the ILFD control signal allows the ILFD to operate at or near the center of the locking range for the plurality of VCO oscillating frequencies, and wherein during the calibration procedure, the calibration circuitry sets a VCO control voltage to a predetermined value to disable a phase/frequency detector and charge pump of the PLL.

* * * * *